United States Patent [19]
Kaplinsky

[11] Patent Number: 5,920,210
[45] Date of Patent: *Jul. 6, 1999

[54] INVERTER-CONTROLLED DIGITAL INTERFACE CIRCUIT WITH DUAL SWITCHING POINTS FOR INCREASED SPEED

[76] Inventor: Cecil H. Kaplinsky, 140 Melville Ave., Palo Alto, Calif. 94301

[*] Notice: This patent issued on a continued prosecution application filed under 37 CFR 1.53(d), and is subject to the twenty year patent term provisions of 35 U.S.C. 154(a)(2).

[21] Appl. No.: 08/754,755

[22] Filed: Nov. 21, 1996

[51] Int. Cl.[6] .......................... H03K 5/153; H03K 19/017
[52] U.S. Cl. .......................... 327/112; 327/108; 327/379; 327/374; 326/21; 326/27; 326/83
[58] Field of Search ...................................... 327/108, 112, 327/379, 387, 388, 374; 326/21, 26, 27, 56, 57, 58, 80, 81, 82, 83, 86, 87, 63, 68

[56] References Cited

U.S. PATENT DOCUMENTS

| | | | |
|---|---|---|---|
| 4,785,201 | 11/1988 | Martinez | 307/443 |
| 4,806,794 | 2/1989 | Walters, Jr. | 307/451 |
| 4,825,101 | 4/1989 | Walters, Jr. | 307/270 |
| 4,877,980 | 10/1989 | Kubinec | 327/111 |
| 4,987,324 | 1/1991 | Wong et al. | 307/451 |
| 5,008,568 | 4/1991 | Leung et al. | 307/451 |
| 5,034,623 | 7/1991 | McAdams | 307/290 |
| 5,059,821 | 10/1991 | Murabayashi et al. | 307/360 |
| 5,165,046 | 11/1992 | Hesson | 307/270 |
| 5,371,420 | 12/1994 | Nakao | 326/82 |
| 5,488,322 | 1/1996 | Kaplinsky | 327/74 |
| 5,604,453 | 2/1997 | Pedersen | 326/83 |
| 5,684,410 | 11/1997 | Guo | 326/83 |
| 5,694,065 | 12/1997 | Hamasaki et al. | 326/83 |

FOREIGN PATENT DOCUMENTS

| | | | |
|---|---|---|---|
| 1-162414 | 6/1989 | Japan | 326/58 |
| 2-92112 | 3/1990 | Japan | 326/27 |
| 5-7147 | 1/1993 | Japan | 326/83 |
| 5-206831 | 8/1993 | Japan | 326/83 |
| 6-90159 | 3/1994 | Japan | 326/83 |

OTHER PUBLICATIONS

T. Iima et al., "Capacitance Coupling Immune, Transient Sensitive Accelerator for Resistive Interconnect Signals of Sub–quarter Micron ULSI", *IEEE Journal of Solid–State Circuits*, vol. 31, No. 4, Apr. 1996, pp. 531–536.

*Primary Examiner*—Timothy P. Callahan
*Assistant Examiner*—Eunja Shin
*Attorney, Agent, or Firm*—Thomas Schneck; Mark Protsik; John P. McGuire, Jr.

[57] ABSTRACT

A digital interface circuit has two inverters with different switching points, one below and one above the nominal transition point of the circuit. Each inverter controls both pull-up and pull-down output transistors. The inverter with the low switching point controls the low-to-high signal transition, while the inverter with the high switching point controls the high-to-low signal transition. Pass gates responsive through delay elements to either the circuit input, an inverter output, or the circuit output isolate the other inverter from the output transistors. The pass gates may also be tristatable by means of a logical combination of the delayed pass gate enable signals with output enable signals. In yet another embodiment, the pair of inverters are replaced by a single inverter with dual switching points.

16 Claims, 3 Drawing Sheets

INVERTER-CONTROLLED DIGITAL INTERFACE CIRCUIT WITH DUAL SWITCHING POINTS FOR INCREASED SPEED

TECHNICAL FIELD

The present invention relates to digital interface circuits (buffers, drivers, level-translators) in integrated circuits, and in particular to such interface circuits that have different switching points for low-to-high and high-to-low signal transitions in order to reduce throughput delay and thereby increase speed.

BACKGROUND ART

In U.S. Pat. No. 5,059,821, Murabayashi et al. describe a driver circuit having a complementary pair of bipolar output transistors and a pair of CMOS inverter predriver circuits. Each predriver inverter is connected to one of the output transistors to control its ON/OFF operation. The predriver circuits have different switching thresholds which have been chosen to ensure that both output transistors are not ON at the same time during a transition, thereby reducing power consumption.

In U.S. Pat. No. 5,488,322, Kaplinsky describes a digital interface circuit having a pair of comparators controlling a pair of pull-up and pull-down output transistors, respectively. The comparators, preferably CMOS differential amplifiers, receive different reference voltages selected to allow the comparators to recognize the beginning of an input signal transition sooner. In particular, the comparator controlling the pull-up output transistor receives a 0.8 V reference, while the comparator controlling the pull-down output transistor receives a 2.0 V reference, where the circuit's nominal transition point is 1.5 V. Each comparator controls only one of the two output transistors. Further, only one comparator is active at a time, and the active comparator is disabled after the nominal transition point has been reached at the circuit output. Antidrift buffers maintain the output level until the next transition.

It has been discovered that comparators with the required speed dissipate a significant amount of DC power (typ., at least 1 mA) even when at rest. Moreover, when the input reference voltages are distant from the center point between the high and low voltage states, the comparators have asymmetric driving power. The circuit then tends to be very strong in pulling the output up, but slow in pulling the output down.

In U.S. Pat. No. 5,034,623, McAdams discloses a CMOS input buffer with hysteresis that includes a first n-channel pull-up transistor with its source connected to a voltage supply and its gate connected to a voltage reference generator to provide a first reference voltage on its drain, a first p-channel transistor with its source connected to the pull-up transistor to receive the first reference voltage and with its gate connected to an input of the buffer, second and third n-channel transistors connected in series between the first p-channel transistor's drain and a common potential, with their gates also connected to the input of the buffer, an inverter with its input connected to the drain of the first p-channel transistor and with its output forming an output of the buffer, and a fourth p-channel transistor with its gate connected to the buffer output, its drain connected to the series connection between the second and third transistors and its source connected to receive a second reference voltage. By appropriate sizing of the transistors, high and low level trip points of the circuit may be adjusted.

In IEEE Journal of Solid-State Circuits, vol. 31, no. 4, April 1996, pages 531–536, Iima et al. disclose a transient sensitive trigger circuit which uses a Schmitt-trigger to control activation of an upper or lower half of a second inverter portion connected in parallel with a first inverter portion. When the upper half is active during a high-to-low input signal transition, there are two p-channel pull-up paths versus only one n-channel pull-down path for the output, so that the logical threshold increases. During a low-to-high input signal transition, the lower half of the second inverter portion is active so that there are two n-channel pull-down paths versus only one p-channel pull-up path for the output, so that the logical threshold decreases. The circuit thus acts as an inverter with hysteresis. The Schmitt-trigger is responsive directly to the input signal of the circuit.

An object of the invention is to provide an improved digital interface circuit with increased speed, low current consumption during both rest and transitions, and symmetric pull-up and pull-down strength.

DISCLOSURE OF THE INVENTION

The object has been met in a first embodiment of the present invention by a digital interface circuit in which a pair of input inverters with different transition or switching points separately control the pull-up and pull-down operations of a pair of output transistors. The switching points have been selected so as to speed up recognition of signal transitions on the circuit's input, which is connected to the respective inputs of the two inverters. In particular, the switching point of a first inverter controlling the pull-up operation of the output transistors has been selected to be less than a nominal transition point of the circuit, so that a low-to-high input signal transition is recognized before the nominal transition point is reached. Likewise, the switching point of a second inverter controlling the pull-down operation of the output transistors has been selected to be greater than the circuit's nominal transition point, so that high-to-low input signal transistors are recognized before the nominal transition point is reached. Thus, the pull-up or pull-down of the circuit's output begins sooner, decreasing the throughput time or delay between the respective input and output signal transitions.

The circuit further includes a set of transistor pass gates in the control paths between the pair of input inverters and each of the pair of output transistors. The pass gates isolate the pull-up-controlling first inverter from the output transistors during a pull-down operation, and likewise isolate the pull-down-controlling second inverter from the output inverters during a pull-up operation. This keeps the two input inverters from fighting each other whenever a transitioning input signal is at a voltage between the inverters' respective switching points. The pass gates allow only one of the two inverters to have active control of the pair of output transistors at any one time. The pass gates themselves are controlled by complementary enable signals that are generated from either the input signal, the output signal or one of the inverter outputs, with a switch delay provided to avoid oscillation by the circuit. In a second embodiment of the present invention, the enable signals provided to the pass gates are further generated by logic gates receiving an output enable. The circuit can then have a tristate output when all four pass gates are disabled, isolating both input inverters from the output transistors.

The object is also met in a third embodiment of the present invention in which the digital interface circuit has a single input inverter element with dual switching points driving the output transistors of the circuit. The single inverter replaces the two input inverters of the first two embodiments, eliminating the need for the pass gate isolation of the input inverters from the output transistors. This dual-switching-point inverter has a pair of parallel pull-up paths and a pair of parallel pull-down paths through respective first and second pull-up transistors, and first and second pull-down transistors. In addition, the second pull-up and pull-down paths include third pull-up and pull-down transistors in series with the respective second transistors. The first and second sets of transistors are all driven by the circuit input, while the third set of transistors is driven through an RC delay by the inverter's output located at the node connecting each of the pull-up and pull-down paths together. The third transistors operate to shut off the second pull-down path when the input is low and during a low-to-high transition, thereby shifting the inverter's switching point down below the circuit's nominal transition point, and to shut off the second pull-up path when the input is high and during a high-to-low transition, thereby shifting the inverter's switching point up above the circuit's nominal transition point. Thus, input signal transitions are recognized before they reach the nominal transition point of the circuit.

BEST MODE OF CARRYING OUT THE INVENTION

As used in the present disclosure, the term "digital interface circuit" is meant to encompass circuitry that is operable as digital signal buffers, drivers and level-shifters. Thus, it includes transitional or buffering circuits which serve to isolate the current paths between two circuits or between different portions of the same circuit, while transmitting an input signal received from one circuit or portion to a buffer output connected to another portion or circuit. It also includes driver circuits that take an input signal of relatively low power and provide a corresponding output signal of higher power and current handling capabilities able to drive a load. Further, level shifting circuits (also known as level-translators) accept digital input signals at one pair of voltage levels and deliver output signals at a different pair of voltage levels, allowing two circuits or circuit portions of different logic families to be connected. With appropriate modifications, the digital interface circuits of the present invention are able to perform any of these functions.

Figure 1:
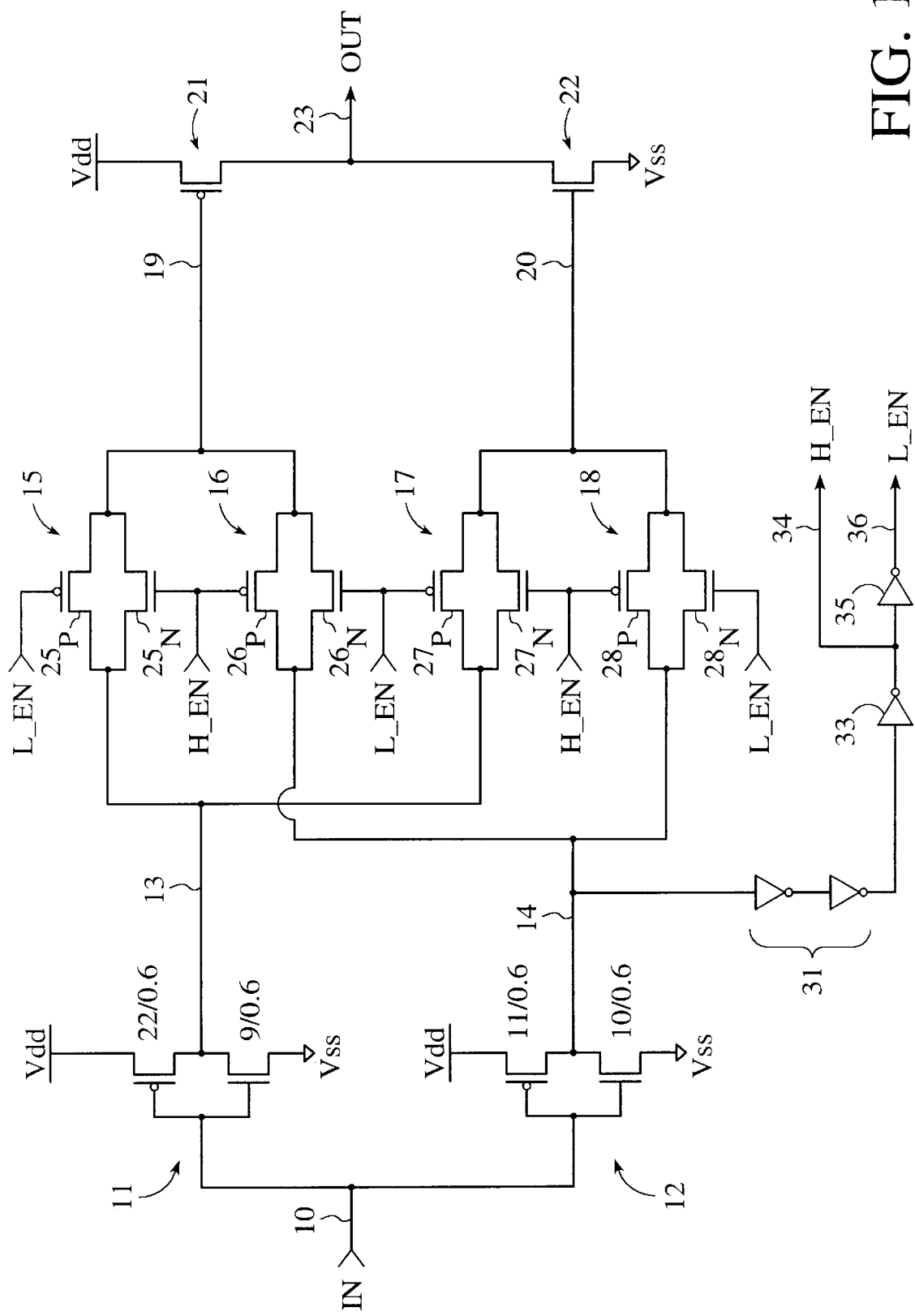
FIG. 1 is a schematic plan view of a first embodiment of a digital interface circuit of the present invention.

With reference to FIG. 1, a first digital interface circuit embodiment of the present invention has an interface circuit input 10 receiving a digital input signal IN. The input 10 is connected to the inputs of two CMOS inverters 11 and 12 having different switching points. In particular, the first inverter 11 has a switching point of about 1.8 to 2.0 V while the second inverter 12 has a switching point of about 0.8 to 1.0 V. This can be achieved by appropriate sizing of the respective p-channel pull-up and n-channel pull-down transistors of the CMOS inverters 11 and 12. For example, in a typical 0.6 micron CMOS technology, the transistor sizes (channel width/length in microns) may be 22/0.6 and 9/0.6 for the p-channel and n-channel transistors of first inverter 11, and 11/0.6 and 10/0.6 for the p-channel and n-channel transistors of second inverter 12. (Note that these sizes are exemplary only and will vary from one circuit technology to another.) The inverters 11 and 12 are powered by first and second voltage supply lines $V_{dd}=3$ V and $V_{ss}=0$ V. The outputs 13 and 14 of the respective inverters 11 and 12 connect through pass gates 15–18 to the control gate inputs 19 and 20 of output transistors 21 and 22. That is, first inverter 11 connects through pass gate 15 to first output transistor 21 and through pass gate 17 to second output transistor 22, and second inverter 12 connects through pass gate 16 to first output transistor 21 and through pass gate 18 to second output transistor 22. Thus, first output transistor 21 is capable of being driven by either inverter 11 or 12 through respective pass gates 15 and 16, and, likewise, second output transistor 22 is capable of being driven by either inverter 11 or 12 through respective pass gates 17 and 18. The output transistors 21 and 22 are respective p-channel pull-up and n-channel pull-down transistors that are connected in series between first and second voltage supply lines $V_{dd}$ and $V_{ss}$. An interface circuit output 23 providing an output signal OUT is located at the node between the two output transistors 21 and 22.

The pass gates 15–18 may be made up of p-channel transistors $25_P$–$28_P$ and n-channel transistors $25_N$–$28_N$ connected in parallel between the respective inverter outputs 13 and 14 and the respective output transistor control gate inputs 19 and 20, and controlled by complementary enable signals L_EN and H_EN. When L_EN is low and H_EN is high, pass gates 15 and 17 are on, allowing signals output by first inverter 11 on its output 13 to drive the output transistors 21 and 22, while pass gates 16 and 18 are off, blocking signal transmission through these gates and thereby isolating the output 14 of second inverter 12 from the output transistors 21 and 22. When L_EN is high and H_EN is low, pass gates 15 and 17 are off and pass gates 16 and 18 are on, so that the first inverter 11 is isolated from the output transistors 21 and 22 and the second inverter 12 drives the output transistors 21 and 22.

The complementary enable signals L_EN and H_EN may be generated from either the input signal IN, the signal on either output 13 or 14 of inverters 11 and 12, or the output signal OUT itself. For proper operation according to the present invention, the enable signals are such that when the output signal OUT is high, i.e. greater than about 2.0 V, L_EN is low and H_EN is high, so that the first inverter 11 with its 1.8 to 2.0 V switching point controls the output transistors 21 and 22. And, when the output signal OUT is low, i.e. less than about 0.8 V, L_EN is high and H_EN is low, so that second inverter 12 with its 0.8 to 1.0 V switching point controls the output transistors 21 and 22. To meet this requirement when either the input signal IN or the output 13 or 14 from either inverter 11 or 12 is used to generate the enable signals L_EN and H_EN, a suitable time delay of about 1.5 ns is needed. In FIG. 1, a set of delay elements 31, such as two or more small inverters, is provided in the signal path between second inverter output 14 and another pair of successive inverters 33 and 35. The output 34 of third inverter 33 provides the high enable signal H_EN, while the output 36 of fourth inverter 35 provides the low enable signal L_EN.

Figure 2:
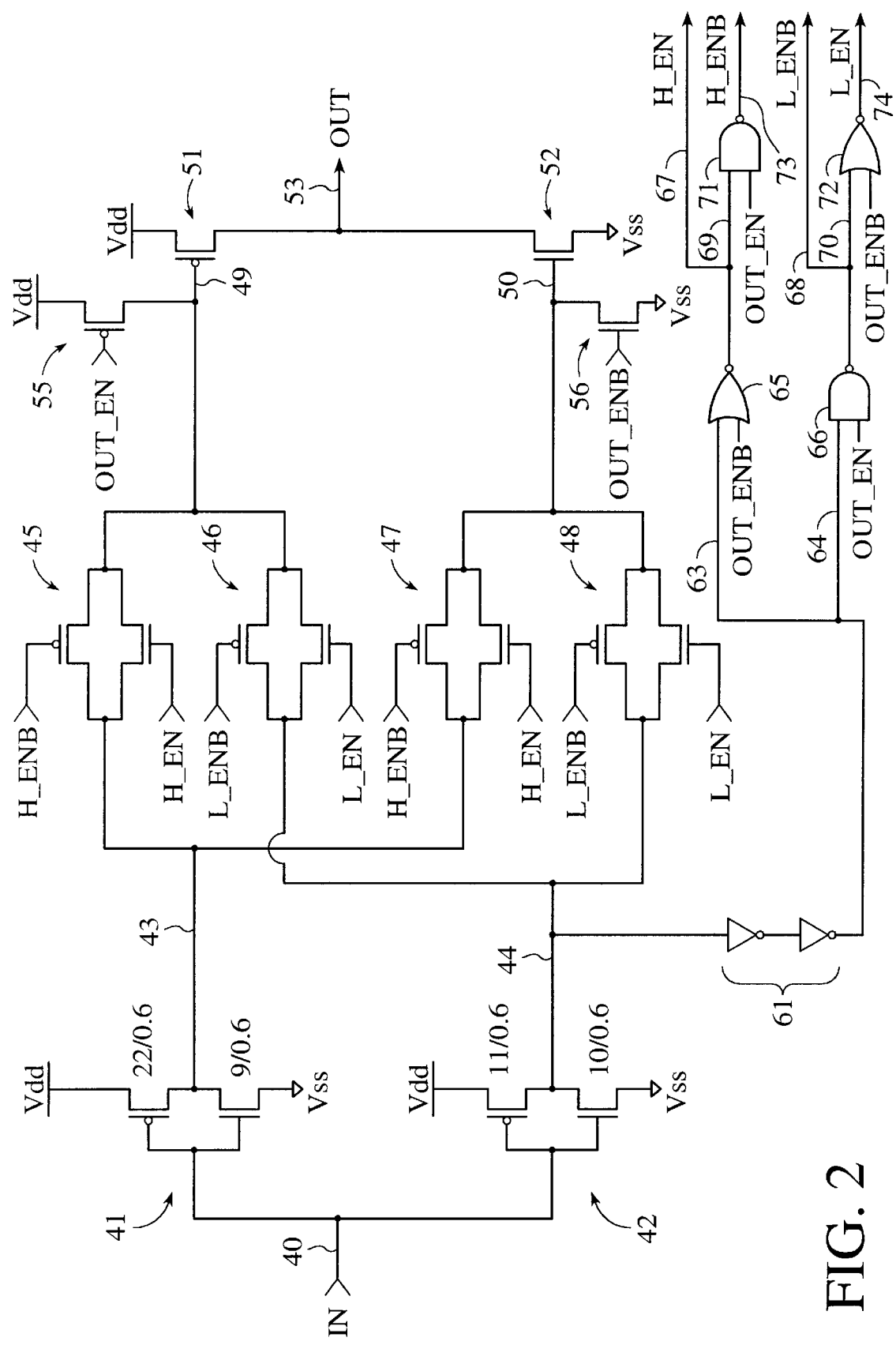
FIG. 2 is a schematic plan view of a second embodiment of a digital interface circuit of the present invention with a tristate output.

An alternative arrangement with tristate capability is seen in FIG. 2. As in the first embodiment, an interface circuit input 40 receives an input signal IN and transmits it to a pair of inverters 41 and 42 with respective 1.8–2.0 V and 0.8–1.0 V switching points. The inverter outputs 43 and 44 connect to the control gate inputs 49 and 50 of pull-up and pull-down output transistors 51 and 52 via four pass gates 45–48. An interface circuit output signal OUT is provided at an output node 53 between the two output transistors 51 and 52. Each pass gate 45–48 has a pair of complementary transistors connected in parallel which are controlled by complementary enable signals, either H_EN and H_ENB or L_EN and L_ENB. As before, these enable signals allow the first inverter 41 to control operation of the output transistors 51 and 52 when the output signal OUT is high (>2.0 V) and allow second inverter 42 to control operation of the output transistors 51 and 52 when the output signal OUT is low (21 0.8 V), while blocking control by the other inverter. Further, the enable signals can be tristated so that all pass gates 45–48 are off, blocking the switching control of both inverters 41 and 42.

The enable signals can again be generated either from the input signal IN, the output signal OUT, or output 43 or 44 of either inverter 41 or 42. In order to operate properly in accord with the present invention, enable signals that are generated from other than the output signal OUT require a time delay of about 1.5 ns provided by delay element 61, such as two or more inverters, to ensure that such enable signals do not switch until a transition at the interface circuit output OUT is essentially complete. The output of the delay element 61 is connected to a set of NAND and NOR logic gates 65, 66, 71 and 72 that are responsive to complementary output enable signals OUT_EN and OUT_ENB. First NOR gate 65 has one input 63 connected to the output of delay element 61 and another input receiving output enable signal OUT_ENB. First NAND gate 66 has one input 64 connected to the output of delay element 61 and another input receiving output enable signal OUT_EN. A second NAND gate 71 has one input 69 connected to the output of first NOR gate 15 and another input receiving output enable signal OUT_EN. A second NOR gate 72 has one input 70 connected to the output of first NAND gate 66 and another input receiving output enable signal OUT_ENB. The outputs 67, 73, 68 and 74 of first NOR gate 65, second NAND gate 71, first NAND gate 66 and second NOR gate 72 provide the pass gate enable signals H_EN, H_ENB, L_ENB and L_EN, respectively. First and third pass gates 45 and 47, connected to the output 43 of first inverter 41, both receive the complementary pass gate enable signals H_EN and H_ENB, which are respectively high and low when the output signal OUT is high, allowing first of inverter 41 to control a pull-down operation. Second and fourth pass gates 46 and 48, connected to the output 44 of second inverter 42, both receive the complementary pass gate enable signals L_EN and L_ENB, which are respectively high and low when the output signal OUT is low, allowing second inverter 42 to control a pull-down operation. When output enable signals OUT_EN and OUT_ENB are respectively low and high, pass gate enable signals L_EN and H_EN are both low, while L_ENB and H_ENB are both high, so that all pass gates 45–48 are disabled. Then node 49 is pulled high by transistor 55 and node 50 is pulled low by transistor 56, so that both output transistors 51 and 52 are inactive and the output node 53 is in a high impedance state.

A basic operating principle of the first two embodiments shown in FIGS. 1 and 2 is the rapid recognition of a transition in the interface circuit's input 10 or 40. In particular, the circuit has a nominal transition point of about 1.5 V, but the first inverter 11 or 41 that controls pull-down operation of the output transistors 21 and 22 or 51 and 52 has a switching point of about 1.8 to 2.0 V that is greater than this nominal transition point, and the second inverter 12 or 42 that controls pull-up operation of the output transistors has a switching point of about 0.8 to 1.0 V that is less than the nominal transition point. Thus, when the input signal IN falls from high to low, the transition is recognized by the first inverter 11 or 41 by the time it has dropped below its 1.8 to 2.0 V switching point, i.e. before it has reached the 1.5 V nominal transition point of the circuit and well before it has reached the conventional 0.8 V definition of a low signal level. Thus, the transition on the output 23 or 53 of the circuit will begin sooner than in typical prior devices. Likewise, the second inverter 12 or 42 will recognize an input signal transition from low to high by the time it has reached its 0.8 to 1.0 V switching point, which is before it has reached the nominal transition point and well before it has risen above the defined 2.0 V high signal level. Hence, the overall speed of the interface circuit is increased.

Figure 3:
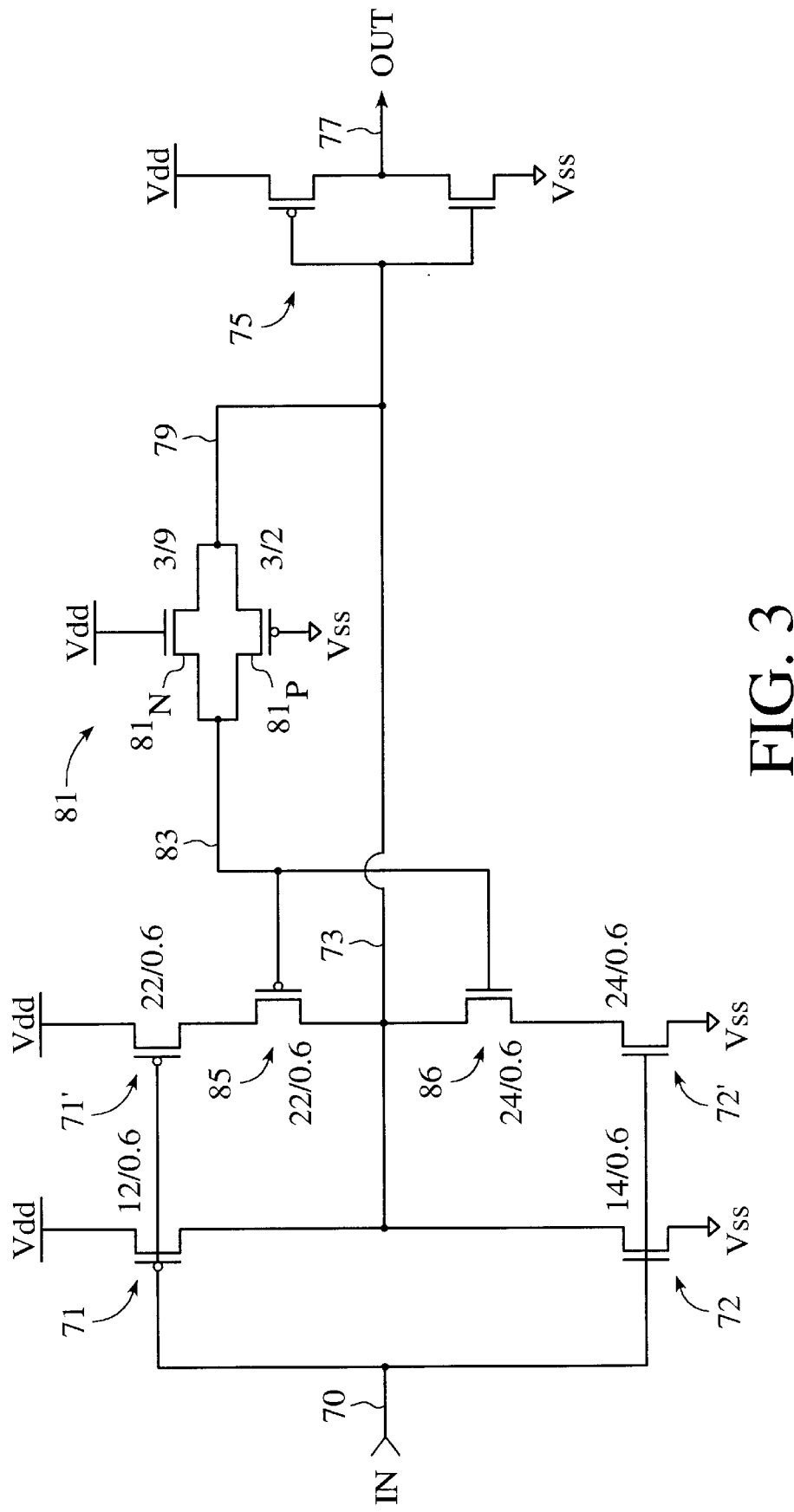
FIG. 3 is a schematic plan view of a third embodiment of a digital interface circuit of the present invention with a single input inverter element having dual switching points.

With reference to FIG. 3, yet another interface circuit embodiment of the present invention replaces the two inverters 11 and 12, or 41 and 42, of the first two embodiments with a single inverter having dual switching points. For a high-to-low input signal transition it has a first 1.8 to 2.0 V switching point and for a low-to-high input signal transition it has a second 0.8 to 1.0 V switching point. Again, signal transitions on the input are recognized prior to their reaching either the nominal transition point of the interface circuit or the defined voltages for low and high logic levels. The interface circuit in FIG. 3 has an input 70 receiving an input signal IN that drives the gates of two p-channel pull-up transistors 71 and 71' and two n-channel pull-down transistors 72 and 72'. First pull-up and pull-down transistors 71 and 72 are connected in series between first and second voltage supply lines $V_{dd}$ (=3 V) and $V_{ss}$ (=0 V) with an output 73 of the inverter connected to a node between the two transistors 71 and 72. Second pull-up and pull-down transistors 71' and 72' are also connected in series between the first and second voltage supply lines $V_{dd}$ and $V_{ss}$, but with a third p-channel pull-up transistor 85 and a third n-channel pull-down transistor 86 intervening in the current path from the first voltage supply line $V_{dd}$ through the second pull-up transistor 71' to the inverter output 73 and from the inverter output 73 through the second pull-down transistor 72' to the second voltage supply line $V_{dd}$, respectively. A resistive pass gate 81 has an input 79 connected to the inverter output 73 and an output 83 connected to the gates of third transistors 85 and 86. The pass gate 81 includes parallel n-channel and p-channel transistors $81_N$ and $81_P$, whose control gates are connected to the first and second voltage supply lines $V_{dd}$ and $V_{ss}$ respectively. Thus, both pass gate transistors $81_N$ and $81_P$ are always conducting, but are sized to provide a resistive path between the pass gate input and output 79 and 83. For a typical 0.6 micron CMOS process, transistors $81_N$ and $81_P$ may have channel width/length dimensions (in microns) of 3/9 and 3/2 respectively. Together with the capacitance of the third pull-up and pull-down transistors 85 and 86, they form an RC delay circuit with a propagation delay of about 1 to 2 ns from a signal change at the inverter output 73 to the conduction response of transistors 85 and 86. The delay ensures that the circuit does not oscillate.

When the input signal IN is in a low state, the first and second p-channel pull-up transistors 71 and 71' are on, while the first and second n-channel pull-down transistors 72 and 72' are off. The first inverter output 73 is high, as is the input 83 to the control gates of transistors 85 and 86. Thus, transistor 86 is conducting while transistor 85 is not. During an input signal transition from low to high, the pull-up transistors 71 and 71' turn off, while the pull-down transistors 72 and 72' turn on. However, because of the RC delay through pass gate 81, the transistors 85 and 86 remain in their previous state. Thus, there are two active pull-down paths, one through first pull-down transistor 72 and the other through transistor 86 and second pull-down transistor 72'. But, there is only one active path through first pull-up transistor 71, since the other path is blocked by transistor 85 that is off. This gives the pull-down portion of the inverter a greater effective size than the pull-up portion, so that the switching point is shifted down from the nominal transition point to about 0.8 to 1.0 V. Likewise, when the input is high, the states are reversed, so that, during a high to low transition of the input signal IN, there are two active pull-up paths, but only one path to $V_{ss}$, since transistor 86 is off. The switching point is shifted up from the nominal transition point to about 1.8 to 2.0 V. Thus, transistors of the input signal IN are recognized by the circuit prior to their reaching the nominal transition point and thus the throughput time of the buffer is improved. Typical transistor sizes (channel width/length in microns) for a 0.6 micron technology are 12/0.6 for transistor 71, 14/0.6 for transistor 72, 22/0.6 for transistors 71' and 85, and 24/0.6 for transistors 72' and 86. With these exemplary values the effective switching points are about 0.85 V and 1.95 V for low-to-high and high-to-low input signal transitions, respectively.

The first inverter output 73 drives both p-channel and n-channel output transistors of a second inverter 75 to produce an output signal OUT at an output node 77 between the two output transistors.

I claim:

1. A digital interface circuit, comprising:
    a pull-up transistor and a pull-down transistor connected together in series between a pair of power supply terminals, with a circuit output located at a node between said pull-up and pull-down transistors,
    a first inverter having an input connected to a circuit input and having an output, said first inverter characterized by a first switching voltage that is greater than a nominal switching voltage of the circuit,
    a second inverter having an input connected to said circuit input and having an output, said second inverter characterized by a second switching voltage that is less than said nominal switching voltage,
    four pass gates coupling said outputs of said first and second inverters to control gates of said pull-up and pull-down transistors, a first of said pass gates connected between said first inverter output and said pull-up transistor, a second of said pass gates connected between said second inverter output and said pull-up transistor, a third of said pass gates connected between said first inverter output and said pull-down transistor, and a fourth of said pass gates connected between said second inverter output and said pull-down transistor,
    means, responsive to a first signal received at said circuit input, and also responsive to an output enable signal, for controlling said pass gates such that (a) whenever said output enable signal is at a first level and during a high-to-low transition of said first signal, at least while said first signal has a voltage greater than said second switching voltage, said first and third pass gates connect said first inverter to said control gates of said pull-up and pull-down transistors and said second and fourth pass gates isolate said second inverter from said control gates of said pull-up and pull-down transistors, (b) whenever said output enable signal is at said first level and during a low-to-high transition of said first signal, at least while said first signal has a voltage less than said first switching voltage, said second and fourth pass gates connect said second inverter to said control gates of said pull-up and pull-down transistors and said first and third pass gates isolate said first inverter from said control gates of said pull-up and pull-down transistors, and (c) whenever said output enable signal is at a second level, regardless of the voltage of said first signal, all four of said pass gates isolate both said first and second inverters from said control gates of said pull-up and pull-down transistors, and
    means, connected to said control gates of said pull-up and pull-down transistors, and responsive to said output enable signal, for shutting off both of said pull-up and pull-down transistors whenever said output enable signal is at said second level, whereby said circuit output is in a high impedance state.

2. The circuit of claim 1 wherein said means for controlling includes a delay element connected to an output of one of said inverters for receiving an output signal from said one inverter and providing a selected propagation time of said inverter output signal through said delay element, and means connected to an output of said delay element for generating a complementary pair of control signals from said delayed inverter output signal, said control signals being provided to said pass gates.

3. The circuit of claim 2 wherein said complementary pair generating means includes an inverter.

4. The circuit of claim 2 wherein said complementary pair generating means includes at least one logic gate having an input connected to said output of said delay element and a second input receiving said output enable signal.

5. The circuit of claim 1 wherein said first and second inverters are CMOS inverters, each with respective p-channel and n-channel transistors connected in series between said pair of power supply terminals, relative channel sizes of said transistors being selected to provide said first and second switching voltages of said inverters.

6. The circuit of claim 1 wherein said first switching voltage is in a range from about 1.8 V to 2.0 V, and said second switching voltage is in a range from about 0.8 V to 1.0 V, said nominal switching voltage being about 1.5 V.

7. The circuit of claim 1 wherein said means for controlling said pass gates comprises a set of logic gates with inputs connected to receive said first signal and said output enable signal and providing respective outputs connected to said pass gates.

8. The circuit of claim 7 wherein said logic gates generate complementary pairs of control signals connected to said pass gates, each pass gate including a pair of complementary field-effect transistors connected in parallel between one of said first and second inverters and one of said pull-up and pull-down transistors.

9. The circuit of claim 1 wherein said means for controlling said pass gates is responsive to said first signal via the output of one of said first and second inverters.

10. The circuit of claim 1 wherein said means for controlling said pass gates is responsive to said first signal via a delay element providing a selected propagation time for said first signal through said delay element.

11. A digital interface circuit, comprising:
    a first inverter element connected to a circuit input and having an output, and a second inverter element connected to said output of said first inverter element and having an output which is a circuit output,
    wherein said first inverter element includes a first pull-up path through a first transistor to a first voltage supply line, a second pull-up path through second and third transistors to said first voltage supply line, a first pull-down path through a fourth transistor to a second voltage supply line, a second pull-down path through fifth and sixth transistors to said second voltage supply line, each of said first, second, third, fourth fifth and sixth transistors having a control gate, each of first, second and third transistors being effective for establishing a conductive path in response to a first logic state at its respective control gate, each of said fourth, fifth and sixth transistors being effective for establishing a conductive path in response to a second logic state at its respective control gate, said first logic state being an opposite state from said second logic state;

a non-inverting delay means connecting said output of said first inverter element to control gates of said third and sixth transistors, said first inverter element output connected to all of said first and second pull-up and pull-down paths, said circuit input connected to control gates of said first, second, fourth and fifth transistors, and wherein said output of said first inverter element passes through said non-inverting delay means and is then supplied to said control gates of said third and sixth transistors, wherein said second and third transistors establish opposite conductive states and wherein said fifth and sixth transistors establish opposite conductive states.

12. The circuit of claim 11 wherein said first, second and third transistors are p-channel transistors and said fourth, fifth and sixth transistors are n-channel transistors.

13. The circuit of claim 11 wherein said first and second voltage supply lines are at 3 V and 0 V, respectively.

14. The circuit of claim 11 wherein said second inverter element includes pull-up and pull-down output transistors with said circuit output connected therebetween and with control gates of both said output transistors connected to said first inverter output.

15. The circuit of claim 11 wherein said non-inverting delay means is a resistive pass gate providing in combination with capacitances of said third and sixth transistors an RC delay time.

16. The circuit of claim 11 wherein, during a transition of a state of an input signal from low to high, said second pull down path is not conductive and said first pull down path, said first pull up path, and said second pull up path are conductive; and wherein, during a transition of the state of the input signal from high to low, said second pull up path is not conductive and said first pull up path, said first pull down path and said second pull down path are conductive.

* * * * *